United States Patent
Alhussien et al.

(10) Patent No.: US 9,292,377 B2
(45) Date of Patent: Mar. 22, 2016

(54) DETECTION AND DECODING IN FLASH MEMORIES USING CORRELATION OF NEIGHBORING BITS AND PROBABILITY BASED RELIABILITY VALUES

(71) Applicant: Seagate Technology LLC, Cupertino, CA (US)

(72) Inventors: Abdel Hakim S. Alhussien, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 139 days.

(21) Appl. No.: 13/731,766

(22) Filed: Dec. 31, 2012

(65) Prior Publication Data

US 2013/0185599 A1    Jul. 18, 2013

Related U.S. Application Data

(63) Continuation-in-part of application No. 13/063,874, filed on Mar. 14, 2011, now Pat. No. 9,064,594, and a continuation-in-part of application No. 12/920,407, filed on Jan. 4, 2011, now Pat. No. 8,724,381, and a (Continued)

(51) Int. Cl.
*G06F 11/10*    (2006.01)
*G06F 12/02*    (2006.01)

(Continued)

(52) U.S. Cl.
CPC ............ *G06F 11/10* (2013.01); *G06F 11/1048* (2013.01); *G06F 12/0246* (2013.01); *G06F 2212/1032* (2013.01); *G11C 11/56* (2013.01); *G11C 16/34* (2013.01)

(58) Field of Classification Search
CPC . G06F 12/0246; G06F 11/1048; G06F 11/10; G06F 11/1072; G06F 11/1068; G06F 2212/2022; G06F 2212/1032; G11C 16/3418; G11C 16/3431; G11C 16/34; G11C 11/5642; G11C 7/02; G11C 7/04
See application file for complete search history.

(56) References Cited

U.S. PATENT DOCUMENTS

| | | | |
|---|---|---|---|
| 4,015,238 A | 3/1977 | Davis | |
| 5,867,429 A | 2/1999 | Chen et al. | |

(Continued)

FOREIGN PATENT DOCUMENTS

| | | |
|---|---|---|
| JP | H11283396 | 10/1999 |
| JP | 2000149592 | 5/2000 |

(Continued)

OTHER PUBLICATIONS

Engh L.D.; Kordesch, A.V.; Chun-Mai Liu, "A Self Adaptive Programming Method with 5 mV Accuracy for Multi-Level Storage in Flash," Custom Integrated Circuits Conference, 2002. Proceedings of the IEEE 2002, vol., No., pp. 115, 118, 2002.

(Continued)

*Primary Examiner* — Sanjiv Shah
*Assistant Examiner* — Glenn Gossage
(74) *Attorney, Agent, or Firm* — Ryan, Mason & Lewis, LLP

(57) ABSTRACT

Methods and apparatus are provided for detection and decoding in flash memories using a correlation of neighboring bits or errors in neighboring bits. Data from a flash memory device is processed by obtaining one or more read values for a plurality of bits in one or more pages of the flash memory device; converting the one or more read values for the plurality of bits to a reliability value, such as a log likelihood ratio (LLR), for a given bit among said plurality of bits based on a probability that a data pattern was written to the plurality of bits given that a particular pattern was read from the plurality of bits; and decoding the given bit in a given page of the one or more pages using the reliability value. The probability may be obtained from one or more transition probability tables, or may be based on one or more reference cells, prior decoded decisions or performance factors.

30 Claims, 9 Drawing Sheets

Related U.S. Application Data continuation-in-part of application No. 13/001,278, filed on Feb. 25, 2011, now Pat. No. 8,462,549, and a continuation-in-part of application No. 13/063,888, filed on Aug. 31, 2011, now Pat. No. 8,830,748, and a continuation-in-part of application No. 13/063,895, filed on May 31, 2011, and a continuation-in-part of application No. 13/063,899, filed on May 31, 2011, now Pat. No. 8,892,966.

(51) Int. Cl.
  *G11C 16/34* (2006.01)
  *G11C 11/56* (2006.01)

(56) References Cited

U.S. PATENT DOCUMENTS

| | | | |
|---|---|---|---|
| 6,029,264 | A | 2/2000 | Kobayashi et al. |
| 6,134,141 | A | 10/2000 | Wong |
| 6,625,236 | B1 | 9/2003 | Dent et al. |
| 6,625,778 | B1 | 9/2003 | Nakamura et al. |
| 6,813,322 | B2 | 11/2004 | Fulghum et al. |
| 6,980,140 | B1 | 12/2005 | Rowland et al. |
| 7,107,511 | B2 | 9/2006 | Shen et al. |
| 7,257,026 | B2 | 8/2007 | Yamada et al. |
| 7,299,026 | B2 | 11/2007 | Hayashi |
| 7,388,781 | B2 | 6/2008 | Litsyn et al. |
| 7,508,704 | B2 * | 3/2009 | Honma et al. ......... 365/185.03 |
| 7,526,715 | B2 | 4/2009 | Litsyn et al. |
| 7,573,739 | B2 | 8/2009 | Yun et al. |
| 7,643,342 | B2 | 1/2010 | Litsyn et al. |
| 7,656,707 | B2 | 2/2010 | Kozlov |
| 7,730,384 | B2 | 6/2010 | Graef et al. |
| 7,917,832 | B2 | 3/2011 | Hsieh et al. |
| 7,975,192 | B2 | 7/2011 | Sommer et al. |
| 8,032,810 | B2 | 10/2011 | Ishikawa et al. |
| 8,145,984 | B2 | 3/2012 | Sommer et al. |
| 8,301,986 | B2 | 10/2012 | Jo et al. |
| 8,458,563 | B2 | 6/2013 | Sharon et al. |
| 8,464,131 | B2 | 6/2013 | Sharon et al. |
| 8,830,748 | B2 * | 9/2014 | Haratsch et al. ......... 365/185.09 |
| 2003/0101411 | A1 | 5/2003 | Denno |
| 2004/0032347 | A1 | 2/2004 | Yamazaki |
| 2006/0015802 | A1 | 1/2006 | Hocevar |
| 2006/0195772 | A1 | 8/2006 | Graef et al. |
| 2006/0221714 | A1 | 10/2006 | Li et al. |
| 2007/0089034 | A1 | 4/2007 | Litsyn et al. |
| 2007/0132453 | A1 | 6/2007 | Ogino |
| 2007/0149678 | A1 | 6/2007 | Apoorva et al. |
| 2007/0171714 | A1 | 7/2007 | Wu et al. |
| 2007/0189073 | A1 | 8/2007 | Aritome |
| 2007/0208905 | A1 | 9/2007 | Litsyn et al. |
| 2007/0300130 | A1 | 12/2007 | Gorobets |
| 2008/0019188 | A1 | 1/2008 | Li |
| 2008/0042598 | A1 | 2/2008 | Ilyes et al. |
| 2008/0092014 | A1 * | 4/2008 | Brandman et al. ......... 714/763 |
| 2008/0092015 | A1 * | 4/2008 | Brandman et al. ......... 714/763 |
| 2008/0092026 | A1 * | 4/2008 | Brandman et al. ......... 714/793 |
| 2008/0109703 | A1 * | 5/2008 | Brandman ......... 714/763 |
| 2008/0123420 | A1 | 5/2008 | Brandman et al. |
| 2008/0151617 | A1 | 6/2008 | Alrod et al. |
| 2008/0162791 | A1 | 7/2008 | Eldredge et al. |
| 2008/0244360 | A1 | 10/2008 | Mokhlesi et al. |
| 2008/0291724 | A1 | 11/2008 | Litsyn et al. |
| 2009/0024905 | A1 | 1/2009 | Shalvi et al. |
| 2009/0043951 | A1 | 2/2009 | Shalvi et al. |
| 2009/0228761 | A1 | 9/2009 | Perlmutter et al. |
| 2009/0234792 | A1 * | 9/2009 | Kim et al. ......... 706/50 |
| 2009/0241008 | A1 | 9/2009 | Kim et al. |
| 2009/0241009 | A1 | 9/2009 | Kong et al. |
| 2009/0310406 | A1 | 12/2009 | Sarin et al. |
| 2009/0319868 | A1 | 12/2009 | Sharon et al. |
| 2011/0141815 | A1 | 6/2011 | Haratsch et al. |
| 2011/0145487 | A1 | 6/2011 | Haratsch et al. |
| 2011/0145681 | A1 | 6/2011 | Yang |
| 2011/0167305 | A1 | 7/2011 | Haratsch et al. |
| 2011/0225350 | A1 | 9/2011 | Burger, Jr. et al. |
| 2012/0163085 | A1 | 6/2012 | Alrod et al. |
| 2014/0059406 | A1 | 2/2014 | Hyun et al. |
| 2015/0058536 | A1 | 2/2015 | Seol et al. |

FOREIGN PATENT DOCUMENTS

| | | |
|---|---|---|
| JP | 2005078721 | 3/2005 |
| JP | 2006114078 | 4/2006 |
| WO | 0249039 | 6/2002 |
| WO | 03100791 | 12/2003 |
| WO | 2004023489 | 3/2004 |
| WO | 2006013529 | 2/2006 |
| WO | 2006065655 | 6/2006 |
| WO | 2007043042 | 4/2007 |
| WO | 2007132453 | 11/2007 |
| WO | WO 2007/132453 A2 | 11/2007 |
| WO | WO2007132457 | 11/2007 |
| WO | WO 2007/149678 | 12/2007 |
| WO | WO 2007/149678 A2 | 12/2007 |
| WO | WO2008019347 | 2/2008 |
| WO | WO 2008/042593 A1 | 4/2008 |
| WO | 2008053472 | 5/2008 |
| WO | 2008057822 | 5/2008 |

OTHER PUBLICATIONS

Marandian, M.; Salehi, M., "Low Complexity Iterative Decision Feed-Back Equalizer for 8PSK Modulation in Time Dispersive Channels," IEEE International Symposium on Personal, Indoor and Mobile Radio Communications, vol. 1, pp. A-102 to A-106, Sep.-Oct. 2001.

Xiao Li Yi; Zhu Ming; Zhang Yan Jing; Luo Hong Wei, "Design EG-LDPC Codes for Soft Error Mitigation in Memory," Optoelectronics and Microelectronics Technology (AISOMT), 2011 Academic International Symposium on, pp. 328, 332, Oct. 12-16, 2011.

* cited by examiner

| $b_i b_{i+1}$ | READ PATTERN | | | | 600 |
|---|---|---|---|---|---|
| | 00 | 01 | 10 | 11 | |
| 00 | p(00/00) | p(00/01) | p(00/10) | p(00/11) | |
| 01 | p(01/00) | p(01/01) | p(01/10) | p(01/11) | |
| 10 | p(10/00) | p(10/01) | p(10/10) | p(10/11) | |
| 11 | p(11/00) | p(11/01) | p(11/10) | p(11/11) | |

WRITE PATTERN $a_i a_{i+1}$
LSB PAGE
MSB PAGE
$b_i b_{i+1}$

FIG. 9

READ PATTERN

| $a_i b_i a_{i+1} b_{i+1}$ | 0000 | 0001 | 0010 | 0011 | ... | 1111 |
|---|---|---|---|---|---|---|
| 0000 | p(0000/0000) | p(0000/0001) | p(0000/0010) | p(0000/0011) | | p(0000/1111) |
| 0001 | p(0001/0000) | p(0001/0001) | p(0001/0010) | p(0001/0011) | | p(0001/1111) |
| 0010 | p(0010/0000) | p(0010/0001) | p(0010/0010) | p(0010/0011) | | p(0010/1111) |
| 0011 | p(0011/0000) | p(0011/0001) | p(0011/0010) | p(0011/0011) | | p(0011/1111) |
| 0100 | p(0100/0000) | p(0100/0001) | p(0100/0010) | p(0100/0011) | | p(0100/1111) |
| 0101 | p(0101/0000) | p(0101/0001) | p(0101/0010) | p(0101/0011) | | p(0101/1111) |
| 0110 | p(0110/0000) | p(0110/0001) | p(0110/0010) | p(0110/0011) | | p(0110/1111) |
| 0111 | p(0111/0000) | p(0111/0001) | p(0111/0010) | p(0111/0011) | | p(0111/1111) |
| 1000 | p(1000/0000) | p(1000/0001) | p(1000/0010) | p(1000/0011) | | p(1000/1111) |
| 1001 | p(1001/0000) | p(1001/0001) | p(1001/0010) | p(1001/0011) | | p(1001/1111) |
| ... | | | | | | |
| 1111 | p(1111/0000) | p(1111/0001) | p(1111/0010) | p(1111/0011) | | p(1111/1111) |

WRITE PATTERN $a_i a_{i+1}$

| LSB PAGE | ▨ | |
| MSB PAGE | ▨ | |

$b_i b_{i+1}$

DETECTION AND DECODING IN FLASH MEMORIES USING CORRELATION OF NEIGHBORING BITS AND PROBABILITY BASED RELIABILITY VALUES

CROSS-REFERENCE TO RELATED APPLICATIONS

The present application is a continuation-in-part patent application of U.S. patent application Ser. No. 13/063,874, filed Mar. 14, 2011, entitled "Methods and Apparatus for Soft Data Generation for Memory Devices Based on Performance Factor Adjustment," now U.S. Pat. No. 9,064,594; U.S. patent application Ser. No. 12/920,407, filed Jan. 4, 2011, entitled "Methods and Apparatus for Storing Data in a Multi-Level Cell Flash Memory Device With Cross-Page Sectors, Multi-Page Coding And Per-Page Coding," now U.S. Pat. No. 8,724, 381; U.S. patent application Ser. No. 13/001,278, filed Feb. 25, 2011, entitled "Methods and Apparatus for Read-Side Intercell Interference Mitigation in Flash Memories," now U.S. Pat. No. 8,462,549; U.S. patent application Ser. No. 13/063,888, filed Aug. 31, 2011, entitled "Methods and Apparatus for Soft Data Generation in Flash Memories," now U.S. Pat. No. 8,830,748; U.S. patent application Ser. No. 13/063,895, filed May 31, 2011, entitled "Methods and Apparatus for Soft Data Generation for Memory Devices Using Reference Cells;" and U.S. patent application Ser. No. 13/063,899, filed May 31, 2011, entitled "Methods and Apparatus for Soft Data Generation for Memory Devices Using Decoder Performance Feedback," now U.S. Pat. No. 8,892, 966, each incorporated by reference herein.

The present application is also related to U.S. patent application Ser. No. 13/731,551, filed Dec. 31, 2012, entitled "Multi-Tier Detection and Decoding in Flash Memories," incorporated by reference herein.

FIELD

The present invention relates generally to flash memory devices and more particularly, to improved techniques for mitigating the effect of noise, inter-cell interference (ICI) and other distortions in such flash memory devices with low overall processing delay.

BACKGROUND

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

A number of techniques have been proposed or suggested for mitigating the effect of ICI by reducing the capacitive coupling between cells. While there are available methods to reduce the effect of ICI, it is important that such ICI mitigation techniques do not unnecessarily impair the write-read speeds for flash controllers. Thus, many effective signal processing and decoding techniques are avoided that would introduce significant inherent processing delays. Foregoing such complex signal processing techniques, however, reduces the ability of a flash controller to maintain sufficient decoding accuracy as flash device geometries scale down.

It has been found that errors for neighboring bits in the pages of flash memory devices are correlated. A need therefore exists for detection and decoding techniques to combat errors that do not unnecessarily impair the read speeds for flash controllers. A further need exists for detection and decoding techniques that account for such error correlations.

SUMMARY

Generally, methods and apparatus are provided for detection and decoding in flash memories using a correlation of neighboring bits. According to one aspect of the invention, data from a flash memory device is processed by obtaining one or more read values for a plurality of bits in a given page of the flash memory device; converting the one or more read values for the plurality of bits to a reliability value for a given bit among said plurality of bits based on a probability that a data pattern was written to the plurality of bits given that a particular pattern was read from the plurality of bits; and decoding the given bit in the given page using the reliability value.

In one exemplary embodiment, the probability that the data pattern was written to the plurality of bits given that the particular pattern was read from the plurality of bits is obtained from one or more tables. The (i) data pattern and/or (ii) the particular pattern comprises one or more of the given bit and at least one additional bit in the given page; the given bit and at least one additional bit in a same cell as the given bit and the given bit and at least one additional bit in a different cell as the given bit.

A more complete understanding of the present invention, as well as further features and advantages of the present invention, will be obtained by reference to the following detailed description and drawings.

BRIEF DESCRIPTION OF THE DRAWINGS

FIGS. 8 and 9 illustrate exemplary transition probability tables that record collected intra-wordline statistics indicating a transition probability for a given cell value conditioned on neighboring bits in a wordline.

DETAILED DESCRIPTION

Various aspects of the invention are directed to signal processing techniques for mitigating ICI and other distortions in memory devices, such as single-level cell (SLC) or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash or non-volatile memory devices, such as the use of voltages, currents or resistances to represent stored data, as would be apparent to a person of ordinary skill in the art.

Aspects of the present invention provide detection and decoding techniques with error processing that do not unnecessarily impair the read speeds for flash control systems. According to one aspect of the invention, detection and decoding techniques are provided that account for error correlations between neighboring bits. A reliability value or log likelihood ratio (LLR) for a given bit is generated based on a probability that a given data pattern was written to a plurality of neighboring bits when a particular pattern was read from the plurality of those bits. As used herein, the terms "reliability value" and "LLR" are used interchangeably and shall include approximations of reliability values or LLRs. As used herein, the term "ICI mitigation" includes the mitigation of ICI and other distortions, including but not limited to data-dependent distortions.

While exemplary embodiments are described to address intra-page and inter-page (intra-cell) correlations, the present invention can be applied to compute log likelihood ratios based on any bits in the same page or bits on different pages and/or wordlines. Generally, bits are grouped that have some correlation in terms of read errors. In terms of write errors or hard errors, it is an advantage to group bits that are not likely to suffer from the same defect at the same time. In one exemplary embodiment, only neighboring bits in the same page are read together to maintain on-the-fly (real-time) decoding.

Figure 1:
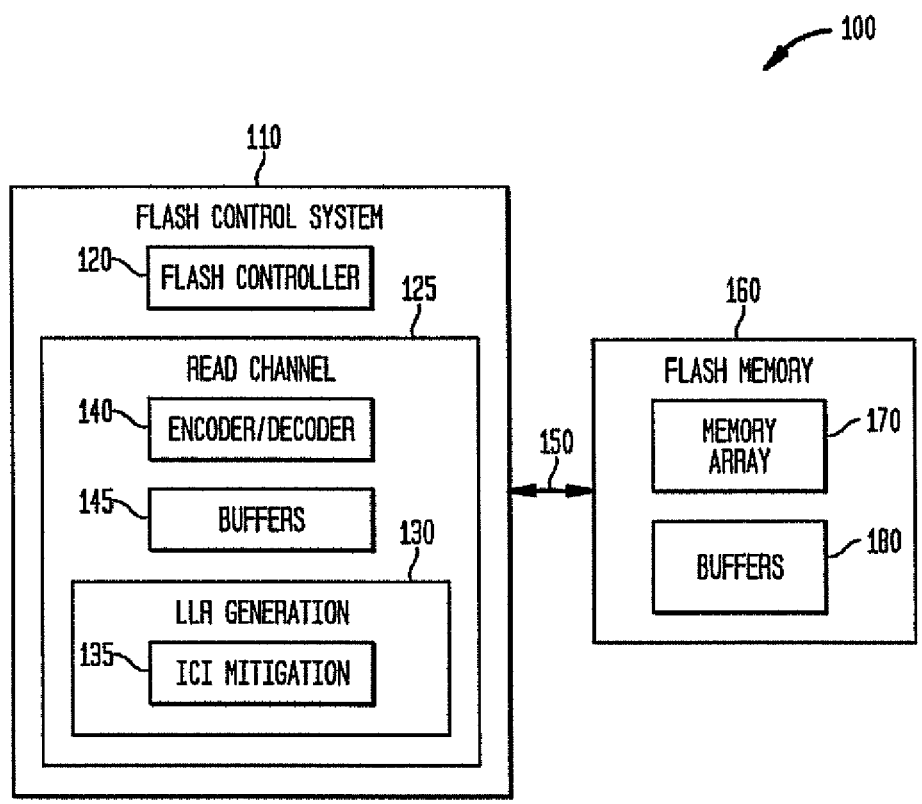
FIG. 1 is a schematic block diagram of an exemplary flash memory system incorporating detection and decoding techniques in accordance with the present invention.

FIG. 1 is a schematic block diagram of an exemplary flash memory system 100 incorporating detection and decoding techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120 and a read channel 125. Moreover, the read channel 125 comprises an encoder/decoder 140, and an LLR generation block 130. Finally, the LLR generation block 130 comprises an ICI mitigation block 135.

As discussed further below in conjunction with FIG. 4, the exemplary flash controller 120 implements one or more iterative detection and decoding processes (discussed further below in conjunction with FIGS. 5 and 7) that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention.

Generally, as discussed further below in conjunction with FIGS. 4, 5 and 7, in a given processing mode, the exemplary LLR generation block 130 processes one or more read values from the flash memory 160, such as single bit hard values and/or quantized multi-bit soft values, and generates LLR values that are applied to the decoder 140, such as an exemplary low density parity check (LDPC) decoder.

Generally, as discussed further below in conjunction with FIGS. 4 and 6-9, the exemplary ICI mitigation block 135 is a function in the LLR generation block 130 that accounts for interference between neighboring cells in either generating the LLRs or computing adjusted read data values, based on which LLRs are computed.

The exemplary flash memory block 160 comprises a memory array 170 and one or more buffers 180 that may each be implemented using well-known commercially available techniques and/or products.

In various embodiments of the disclosed detection and decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to the flash control system 110 in a sequential manner which would incur additional delays. However, those additional delays do not notably increase the overall delay due to their rare occurrence. When additional information-carrying capacity of the interface 150 is desired, the interface 150 may optionally be implemented, for example, in accordance with the teachings of International PCT Patent Application Serial No. PCT/US09/49328, filed Jun. 30, 2009, entitled "Methods and Apparatus for Interfacing Between a Flash Memory Controller and a Flash Memory Array", incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36110, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 150 transfers hard and/or soft read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and decoding techniques are implemented outside the flash memory 160, typically in a process technology optimized for logic circuits to achieve the lowest area. It is at the expense, however, of the additional aggressor cell data that must be transferred on the interface 150.

Figure 2:
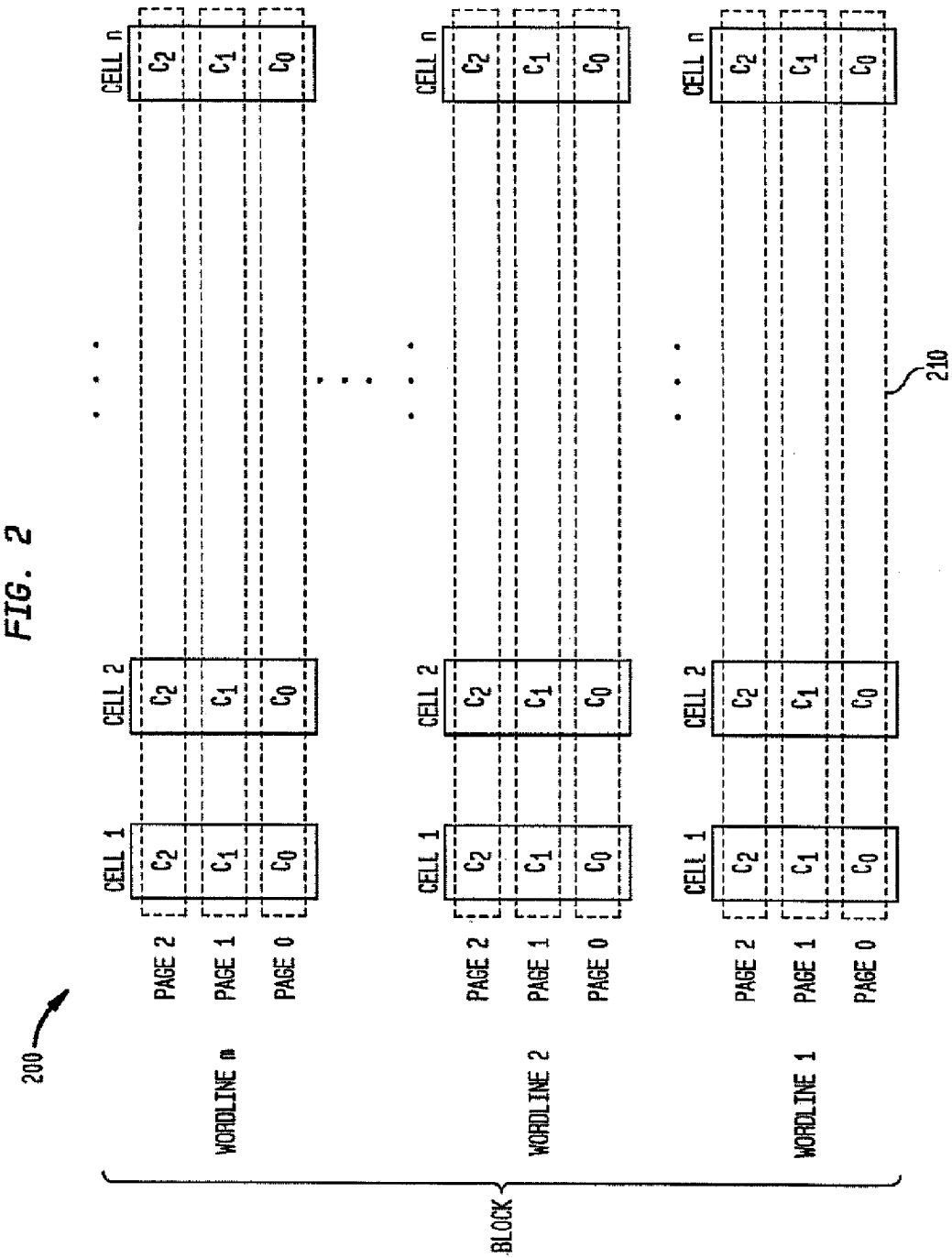
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 (FIG. 1) in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memory devices, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where, for example, cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

It has been found that neighboring bits or errors in neighboring bits are correlated in flash memory devices 160. For example, intra-page correlation addresses the correlation of bits or errors in the same page. In addition, although less severe than intra-wordline correlation, considerable correlations exist between bits of victim cells and those of aggressor cells in interfering wordlines. However, mitigating this correlation would require reading several wordlines and would also result in considerable delays. Hence, such correlations can be accounted for in a recovery mode. In a normal mode of operation, only one page can typically be read at a time, and if error correlations among page bits are accounted for in statistics collection, more errors can be corrected during recovery mode without significantly affecting the random access performance or read throughput, if the recovery mode is not invoked too often.

Intercell Interference

Figure 3:
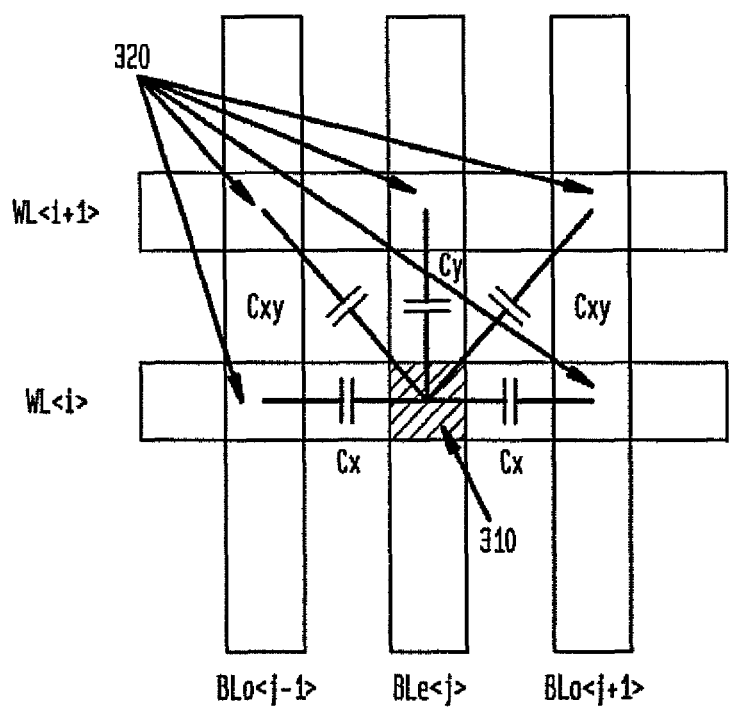
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion. FIG. 3 illustrates the ICI that is present for a target cell 310 due to the parasitic capacitance from a number of exemplary aggressor cells 320. The following notations are employed in FIG. 3:

WL: wordline;
BL: bitline;
BLo: odd bitline;
BLe: even bitline; and
C: capacitance.

Aspects of the present invention recognize that ICI is caused by aggressor cells 320 that are programmed after the target cell 310 has been programmed. The ICI changes the voltage, $V_t$, of the target cell 310. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to ICI as aggressor cells 320, as shown in FIG. 3. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible. In general, the aggressor cells 320 are identified by analyzing the programming sequence scheme (such as bottom up or even/odd techniques) to identify the aggressor cells 320 that are programmed after a given target cell 310.

The ICI caused by the aggressor cells 320 on the target cell 310 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} +$$

$$k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of aggressor cell (w,b), $\Delta V_{ICI}^{(i,j)}$ is the change in $V_t$ voltage of target cell (i,j) due to ICI and $k_x$, $k_y$ and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell when all pages in a wordline are read, or with two or more bits when only one page in a wordline is read, or as a value quantized to a hard voltage level with the same resolution as the number of bits stored per cell (e.g., 3 bits for 3 bits/cell flash) when all pages in a wordline are read, or a value quantized to one hard bit when only one page in a wordline is read.

Figure 4:
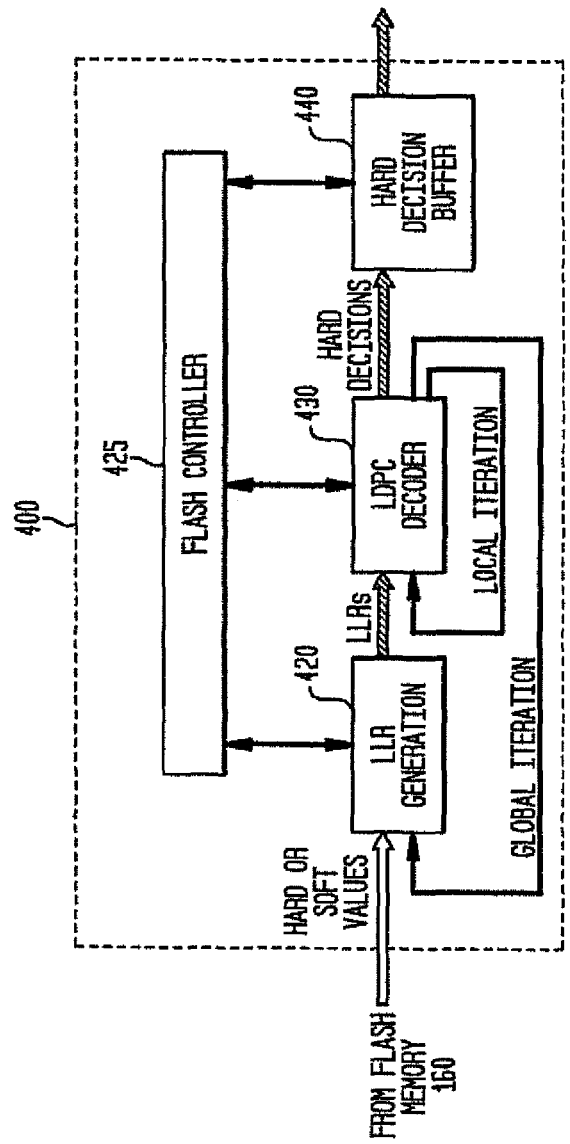
FIG. 4 is a schematic block diagram of an exemplary implementation of a flash memory system incorporating iterative detection and decoding techniques in accordance with aspects of the present invention.

FIG. 4 is a schematic block diagram of an exemplary implementation of a flash memory system 400 incorporating iterative detection and decoding techniques in accordance with aspects of the present invention. As shown in FIG. 4, one or more read values are obtained from the memory array 170 of the flash memory 160. The read values may be, for example, a hard value or a soft value. In a normal mode, for example, a read value is obtained for at least one bit in a given page.

In a given processing mode, such as a normal mode or a recovery mode, an exemplary LLR generation block 420 processes the read values from the flash memory 160, such as single bit hard values and/or quantized multi-bit soft values, and generates LLR values that are applied to an exemplary LDPC decoder 430. The LLR generation performed by the exemplary LLR generation block 420 for detection and decoding is discussed further below in conjunction with FIGS. 6, 8 and 9. The LLR generation block 420 is an example of a reliability unit.

An exemplary flash controller 425 implements one or more detection and decoding processes (discussed further below in conjunction with FIGS. 5 and 7) that incorporate aspects of the present invention. In addition, as discussed further below, an exemplary LDPC decoder 430 processes the LLRs generated by the exemplary LLR generation block 420 and provides hard decisions that are stored in hard decision buffer 440.

As discussed further below, the exemplary LDPC decoder 430 can iteratively decode the LLR values, e.g., until the read values are successfully decoded. Iterations inside the LDPC decoder 430 are called local iterations. In addition, as discussed further below, in one or more exemplary recovery modes, the exemplary LLR generation block 420 and the exemplary LDPC decoder 430 can globally iterate until the read values are successfully decoded. For a more detailed discussion of iteration detection and decoding using local and global iterations, see for example, U.S. patent application Ser. No. 13/063,888, filed Aug. 31, 2011, entitled "Methods and Apparatus for Soft Data Generation in Flash Memories," now U.S. Pat. No. 8,830,748.

Figure 5:
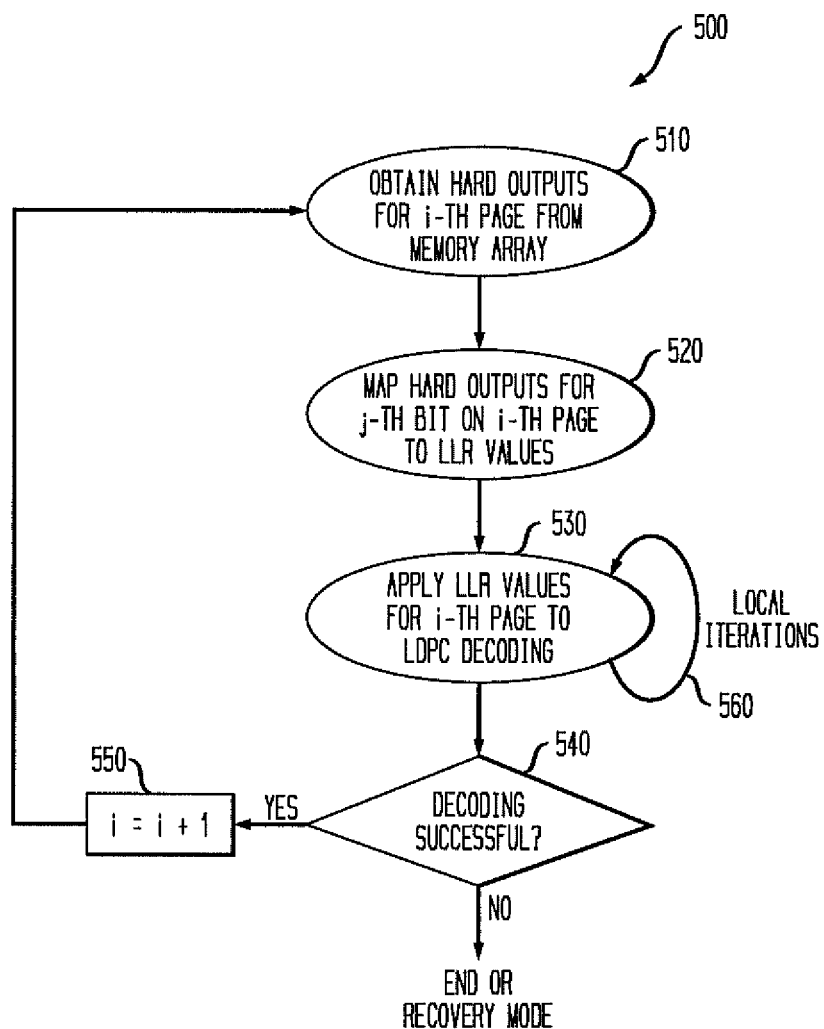
FIG. 5 is a flow chart describing an exemplary normal mode detection and decoding process.

FIG. 5 is a flow chart describing an exemplary normal mode detection and decoding process 500 incorporating aspects of the present invention. Generally, during a normal mode, the flash memory 160 provides only hard outputs. As indicated above, a page-wise access scheme is employed during the normal mode such that additional information on other pages in the same wordline is not required. In addition, the LDPC decoder 430 may not employ global iterations. Thus, as discussed hereinafter, the LLRs are obtained using calculations based on observed data or error statistics of the current page.

As shown in FIG. 5, the exemplary normal mode detection and decoding process 500 initially obtains hard outputs for the i-th page from the memory array 170 during step 510. Thereafter, the exemplary normal mode detection and decoding process 500 employs the LLR generation block 420 to map the hard outputs for the j-th bit on the i-th page to LLR values during step 520, as discussed further below in conjunction with FIG. 6. This mapping operation is either implemented using a look-up table or mathematical operations, where LLRs are computed based on the hard outputs.

The generated LLR values for the i-th page are applied during step 530 to the LDPC decoder 430 for decoding using, for example, a message passing algorithm. The LDPC decoder 430 optionally employs local iterations 560.

A test is performed during step 540 to determine if the decoding was successful. If it is determined during step 540 that the decoding was successful, then the page counter i is incremented during step 550 to process the next page. If, however, it is determined during step 540 that the decoding was not successful, then the exemplary normal mode detection and decoding process 500 either terminates or initiates a recovery mode process 700 (FIG. 7).

As discussed further below in conjunction with FIG. 7, when the recovery mode process 700 ends, program control returns to step 550 to process the next page.

Figure 6:
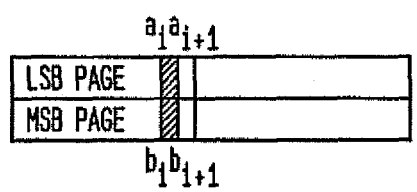
FIG. 6 illustrates an exemplary transition probability table that records collected intra-page statistics indicating a transition probability for a given bit value conditioned on neighboring bits in a page.

As indicated above, the exemplary normal mode detection and decoding process 500 employs the LLR generation block 420 to map the hard outputs for the j-th bit on i-th page to LLR values during step 520 using a bit transition probability table 600, shown in FIG. 6. Generally, the exemplary bit transition probability table 600 records collected intra-page statistics indicating a bit transition probability for a given bit value conditioned on neighboring bits in a page. The size of the transition probability table grows exponentially in the number of considered neighboring bits.

The exemplary normal mode detection and decoding process 500 employs a page-wise access scheme such that the LLRs are obtained using calculations based on the observed error statistics of the current page. The error statistics can be collected using reference cells or past LDPC decisions. For a discussion of these error statistics collection techniques, see, for example, U.S. patent application Ser. No. 13/063,895, filed May 31, 2011, entitled "Methods and Apparatus for Soft Data Generation for Memory Devices Using Reference Cells," or U.S. patent application Ser. No. 13/063,899, now U.S. Pat. No. 8,892,966, filed May 31, 2011, entitled "Methods and Apparatus for Soft Data Generation for Memory Devices Using Decoder Performance Feedback," each incorporated by reference herein.

In FIG. 6, $a_i$ and $b_i$ refer to the lower (or LSB) and upper (or MSB) page bit of cell i. LSB stands for the least significant bit, and MSB for the most significant bit. In the exemplary embodiment, the lower page of a wordline is programmed before the upper page in the same wordline. $a_{i+1}$ and $b_{i+1}$ refer to the lower (or LSB) and upper (or MSB) page bit of cell i+1, which is adjacent to cell i. The bit transition probability table 600 records a probability that each possible pattern was written to bits i and i+1 of the same page (lower or upper page) given that each possible pattern was read (i.e., the reliability of making a decision that a given pattern was written given that a given pattern was read). For example, the term "p(10/00)" indicates the probability that the pattern $b_i b_{i+1}=$'10' was written given that pattern $b_i b_{i+1}=$'00' was read (or the reliability of making a decision '10' given '00' was read in the normal mode). FIG. 6 shows the bit transition probability table 600 for bits $b_i$ and $b_{i+1}$. A similar bit transition probability table can be constructed for bits $a_i$ and $a_{i+1}$ as would be apparent to a person of ordinary skill in the art.

The statistics in the bit transition probability table 600 can be employed to compute LLRs as follows; Given that a particular pattern was read, such as a pattern of '00', the corresponding LLRs for upper page bits can be computed using distribution marginalization as follows:

$$\lambda(b_{i+1}|00)=\log [p(00/00)+p(10/00)]-\log [p(01/00)+p(11/00)]$$

$$\lambda(b_i|00)=\log [p(00/00)+p(01/00)]-\log [p(10/00)+p(11/00)]$$

The probabilities p(00|00), p(01|00), p(10|00) and p(11|00) in the above equations can be obtained from the transition probability table 600.

LLRs can be computed for other given read patterns and for lower page bits in a similar fashion as would be apparent to a person of ordinary skill in the art. For example, if data pattern $b_i b_{i+1}=$'10' is read, the probabilities p(00|10), p(01|10), p(10|10) and p(11|10) are used to compute the corresponding LLRs $\lambda(b_{i+1}|10)$ and $\lambda(b_i|10)$ as follows:

$$\lambda(b_{i+1}|10)=\log [p(00/10)+p(10/10)]-\log [p(01/10)+p(11/10)]$$

$$\lambda(b_i|10)=\log [p(00/10)+p(01/10)]-\log [p(10/10)+p(11/10)]$$

In a further variation, the bit transition probability table 600 can be a function of one or more performance factors, such as endurance, number of program/erase cycles, number of read cycles, retention time, temperature, temperature changes, process corner, ICI impact, location within the memory array 170, location of a wordline and/or a page from which the read values are obtained, location of a page within a wordline from which the read values are obtained and a pattern of aggressor cells. One or more of the performance factors can be varied for one or more different bits within a cell, different pages within a wordline, different bit lines or different hard read data values. For a more detailed discussion of suitable techniques for computing a log likelihood ratio for memory devices based on such performance factor adjustments, see, for example, International Patent Application Serial No. PCT/US09/59069, filed Sep. 30, 2009, entitled "Methods and Apparatus for Soft Data Generation for Memory Devices Based on Hard Data and Performance Factor Adjustment," incorporated by reference herein.

Figure 7:
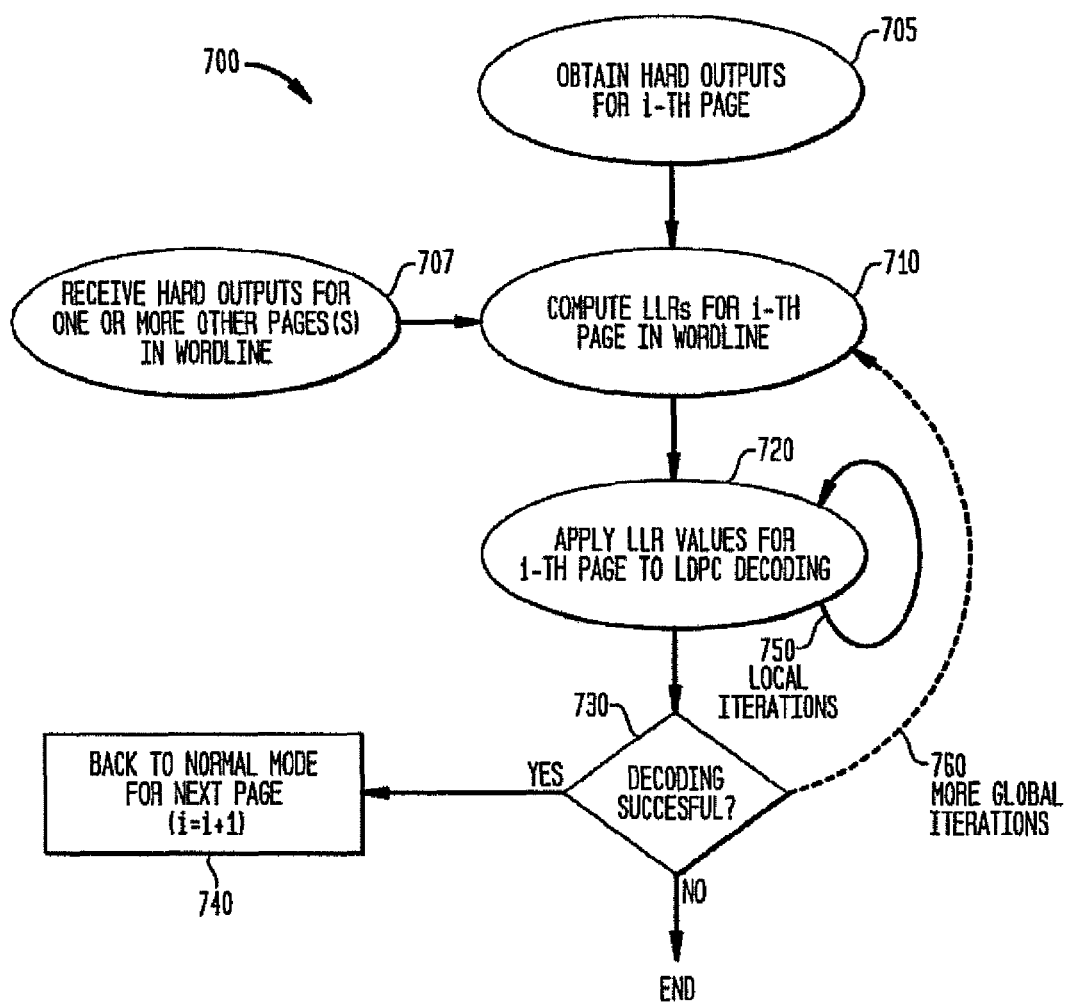
FIG. 7 is a flow chart describing an exemplary recovery mode detection and decoding process.

FIG. 7 is a flow chart describing an exemplary recovery mode detection and decoding process 700 incorporating aspects of the present invention. Generally, during the recovery mode, the flash memory 160 provides hard outputs using wordline (cell) access techniques, where one or more other pages in the same wordline are read. LLRs are computed based on hard outputs from the current page i and one or more other pages in the same word line. These LLRs are utilized by the exemplary recovery mode detection and decoding process 700. In addition, the LDPC decoder 430 may employ one or more global iterations (optionally programmable).

As shown in FIG. 7, the exemplary recovery mode detection and decoding process 700 initially obtains hard outputs for the i-th page (step 705) and one or more other pages in the same wordline (step 707). Hard outputs for the i-th page may still be available from step 510 (FIG. 5) and may therefore be reused. Then, the exemplary recovery mode detection and decoding process 700 computes the LLRs for the i-th page in the current wordline based on hard outputs for the current i-th page and one or more other pages in the same wordline during step 710, as discussed further below in conjunction with FIGS. 8 and 9. As shown in FIG. 7, the LLR computation performed during 710 processes the hard outputs from the i-th page and one or more other pages in the same wordline to compute LLRs for the i-th page.

The LLR values for the i-th page are applied to the LDPC decoder 430 during step 720, optionally using local iterations 750.

A convergence test is performed during step 730 to determine if the decoding was successful. If it is determined during step 730 that the decoding was successful, then the page counter i is incremented during step 740 to process the next page in normal mode 500 (FIG. 5). If, however, it is determined during step 730 that the decoding was not successful, additional global iterations 760 are optionally performed between the LLR generation block 420 and LDPC decoder 430. The global iterations 760 are performed, for example, until a maximum number of global iterations is reached, or until the aforementioned convergence test indicates that decoding is now successful.

Then, if it is determined during step 730 that the decoding was not successful and global iterations have been completed, then the exemplary recovery mode detection and decoding process 700 terminates.

Figure 8:
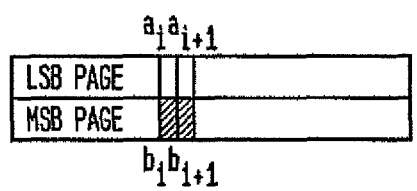

As indicated above, the exemplary recovery mode detection and decoding process 700 employs the LLR generation block 420 to generate the LLRs for the i-th page in the current wordline based on other pages in the wordline during step 710, using a transition probability table 800 or 900 (FIG. 8 or 9, respectively). Generally, the exemplary transition probability table 800 of FIG. 8 records collected intra-wordline statistics indicating a transition probability for a given cell value conditioned on neighboring bits in a wordline (e.g., adjacent bits in the same cell). The size of the transition probability table 800 grows exponentially in the number of considered neighboring bits.

The exemplary recovery mode detection and decoding process 700 uses wordline (cell) access techniques, where the other pages in the wordline are read and LLRs for the current page are obtained using calculations based on the observed error statistics of the current wordline. In the exemplary embodiment, the LLRs are calculated based on error statistics of the adjacent bits in the same cell. The error statistics can be collected using reference cells or past LDPC decisions of the pages in the wordline. For a discussion of suitable error statistics collection techniques, see, for example, U.S. patent application Ser. No. 13/063,895, filed May 31, 2011, entitled "Methods and Apparatus for Soft Data Generation for Memory Devices Using Reference Cells," or U.S. patent application Ser. No. 13/063,899, now U.S. Pat. No. 8,892,966, filed May 31, 2011, entitled "Methods and Apparatus for Soft Data Generation for Memory Devices Using Decoder Performance Feedback," each incorporated by reference herein.

In FIG. 8, $a_i$ and $b_i$ refer to the lower (or LSB) and upper (or MSB) page bit of cell i. LSB stands for the least significant bit, and MSB stands for the most significant bit. In the exemplary embodiment, the lower page of a wordline is programmed before the upper page in the same wordline. $a_{i+1}$ and $b_{i+1}$ refer to the lower (or LSB) and upper (or MSB) page bit of cell i+1, which is adjacent to cell i. The transition probability table 800 records a probability that each possible pattern $a_i b_i$ was written to cell i given that each possible pattern was read (i.e., the reliability of making a decision that a given pattern was written given that a given pattern was read). For example, the term "p(10/00)" indicates the probability that the pattern $a_i b_i$='10' was written to cell i given that pattern $a_i b_i$='00' was read (or the reliability of making a decision '10' given '00' was read in the normal mode). FIG. 8 shows the bit transition probability table for bits $a_i$ and $b_i$ in cell i. This table can also be used for bits in other cells, such as cell i+1 as would be apparent to a person of ordinary skill in the art.

The statistics in the transition probability table 800 can be employed to compute LLRs as follows. Given that a particular pattern was read, such as a pattern of '00', the corresponding LLRs for bits $a_i$ and $b_i$ can be computed using distribution marginalization as follows:

$$\lambda(b_i|00) = \log [p(00/00) + p(10/00)] - \log [p(01/00) + p(11/00)]$$

$$\lambda(a_i|00) = \log [p(00/00) + p(01/00)] - \log [p(10/00) + p(11/00)]$$

The probabilities p(00|00), p(01|00), p(10|00) and p(11|00) in the above equations can be obtained from the transition probability table 800.

LLRs can be computed for other given read patterns and for bits in other cells, such as cell i+1 in similar fashion as would be apparent to a person of ordinary skill in the art.

In a further variation, the transition probability table 800 can be a function of one or more performance factors, including wordline index, as discussed above in conjunction with FIG. 6.

FIG. 9 illustrates an exemplary transition probability table 900 that records collected intra-wordline statistics indicating a transition probability for a given cell value in cell i and an adjacent cell value in cell i+1, that is $a_i b_i a_{i+1} b_{i+1}$ in the same wordline. The probability that the pattern $a_i b_i a_{i+1} b_{i+1}$ was written is conditioned on reading a pattern $a_i b_i a_{i+1} b_{i+1}$. The size of the transition probability table 900 grows exponentially in the number of considered neighboring bits. Thus, the transition probability table 900 records statistics for two bits $a_i b_i$ on different pages in a given cell i of a given wordline and two bits $a_{i+1} b_{i+1}$ on different pages in an adjacent cell i+1.

The exemplary recovery mode detection and decoding process 700 uses wordline (cell) access techniques, where the other pages in the wordline are read and LLRs are obtained using calculations based on the observed error statistics of the current wordline. In the exemplary embodiment of FIG. 9, the LLRs are calculated based on error statistics for two bits $a_i b_i$ on different pages in a given cell of a given wordline and two bits $a_{i+1} b_{i+1}$ on different pages in an adjacent cell. The error statistics can be collected using reference cells or past LDPC decisions of the pages in the wordline. For a discussion of suitable error statistics collection techniques, see, for example, U.S. patent application Ser. No. 13/063,895, filed May 31, 2011, entitled "Methods and Apparatus for Soft Data Generation for Memory Devices Using Reference Cells," or U.S. patent application Ser. No. 13/063,899, now U.S. Pat. No. 8,892,966, filed May 31, 2011, entitled "Methods and Apparatus for Soft Data Generation for Memory Devices Using Decoder Performance Feedback," each incorporated by reference herein.

In FIG. 9, $a_i$ and $b_i$ refer to the lower (or LSB) and upper (or MSB) page bit of cell i. LSB stands for the least significant bit, and MSB stands for the most significant bit. In the exemplary embodiment, the lower page of a wordline is programmed before the upper page in the same wordline. $a_{i+1}$ and $b_{i+1}$ refer to the lower (or LSB) and upper (or MSB) page bit of cell i+1, which is adjacent to cell i. The transition probability table 900 records a probability that each possible pattern $a_i b_i a_{i+1} b_{i+1}$ was written to cell i and cell i+1 given that each possible pattern $a_i b_i a_{i+1} b_{i+1}$ was read (i.e., the reliability of making a decision that a given pattern was written given that a given pattern was read). For example, the term "p(1000/0000)" indicates the probability that the pattern $a_i b_i a_{i+1} b_{i+1}$='1000' was written to cell i and cell i+1 given that pattern $a_i b_i a_{i+1} b_{i+1}$='0000' was read (or the reliability of making a decision '1000' given '0000' was read in the normal mode).

In general, the statistics in the transition probability table 900 can be employed to compute LLRs($a_{i+k}$) as follows. Given that pattern $a_i^r \ldots a_{i+n}^r b_i^r \ldots b_{i+n}^r$ was read, such as a pattern of '0000', the corresponding LLRs capturing intra-page correlation can be computed using distribution marginalization as follows:

$$\lambda^{page}(a_{i+k} | a_i^r \ldots a_{i+n}^r) = \log \left[ \frac{\sum_{a_i \ldots a_{i+k-1} a_{i+k+1} \ldots a_{i+n}} p\left( \begin{array}{c} a_i \ldots a_{i+k-1}, a_{i+k} = 0, \\ a_{i+k+1} \ldots a_{i+n} | a_i^r \ldots a_{i+n}^r \end{array} \right)}{\sum_{a_i \ldots a_{i+k-1} a_{i+k+1} \ldots a_{i+n}} p\left( \begin{array}{c} a_i \ldots a_{i+k-1}, a_{i+k} = 1, \\ a_{i+k+1} \ldots a_{i+n} | a_i^r \ldots a_{i+n}^r \end{array} \right)} \right]$$

Likewise, given that pattern $a_i^r \ldots a_{i+n}^r b_i^r \ldots b_{i+n}^r$ was read, the corresponding LLRs capturing inter-page (intra-wordline) error correlation can be computed using distribution marginalization as follows:

$$\lambda^{cell}(a_{i+k} | a_i^r \ldots a_{i+n}^r b_i^r \ldots b_{i+n}^r) = \log \left[ \frac{\sum_{a_i \ldots a_{i+k-1} a_{i+k+1} \ldots a_{i+n} b_i \ldots b_{i+n}} p\left( \begin{array}{c} a_i \ldots a_{i+k-1}, a_{i+k} = 0, \\ a_{i+k+1} \ldots a_{i+n} b_i \ldots b_{i+n} | a_i^r \ldots a_{i+n}^r b_i^r \ldots b_{i+n}^r \end{array} \right)}{\sum_{a_i \ldots a_{i+k-1} a_{i+k+1} \ldots a_{i+n} b_i \ldots b_{i+n}} p\left( \begin{array}{c} a_i \ldots a_{i+k-1}, a_{i+k} = 1, \\ a_{i+k+1} \ldots a_{i+n} b_i \ldots b_{i+n} | a_i^r \ldots a_{i+n}^r b_i^r \ldots b_{i+n}^r \end{array} \right)} \right]$$

The probabilities p( . . . ) can be obtained from the transition probability table 900. In a further variation, the transition probability table 900 can be a function of one or more performance factors, including wordline index, as discussed above in conjunction with FIG. 6.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for processing data from a flash memory device, comprising:
obtaining one or more read values for a plurality of bits in one or more pages of said flash memory device;
converting said one or more read values for said plurality of bits to a reliability value for a given bit among said plurality of bits based on a probability that a data pattern was written to said plurality of bits given that a particular pattern was read from said plurality of bits; and
decoding said given bit in a given page of said one or more pages using said reliability value.

2. The method of claim 1, wherein said one or more read values comprise one or more of a hard value and a soft value.

3. The method of claim 1, wherein said flash memory device comprises a plurality of cells each capable of storing at least two data levels per cell.

4. The method of claim 1, wherein said decoding comprises a Low Density Parity Check (LDPC) Message Passing decoding.

5. The method of claim 1, wherein said decoding is performed in real-time.

6. The method of claim 1, wherein said reliability value comprises one or more of a log-likelihood ratio and an approximation of a log-likelihood ratio.

7. The method of claim 1, further comprising the step of generating said reliability value for said given bit in said given page using one or more of (i) read values for additional bits of said one or more pages, and (ii) read values for one or more additional bits of at least one additional page in a same wordline as said given page.

8. The method of claim 1, wherein said probability that said data pattern was written to said plurality of bits given that said particular pattern was read from said plurality of bits is obtained from one or more tables.

9. The method of claim 8, wherein one or more of (i) said data pattern and (ii) said particular pattern comprises said given bit and at least one additional bit in said given page.

10. The method of claim 8, wherein one or more of (i) said data pattern and (ii) said particular pattern comprises said given bit and at least one additional bit in a same cell as said given bit.

11. The method of claim 8, wherein one or more of (i) said data pattern and (ii) said particular pattern comprises said given bit and at least one additional bit in a different cell as said given bit.

12. The method of claim 1, wherein said probability that said data pattern was written to said plurality of bits given that said particular pattern was read from said plurality of bits is based on one or more reference cells.

13. The method of claim 1, wherein said probability that said data pattern was written to said plurality of bits given that said particular pattern was read from said plurality of bits is based on one or more prior decoded decisions.

14. The method of claim 1, wherein said probability that said data pattern was written to said plurality of bits given that said particular pattern was read from said plurality of bits is based on one or more performance factors of said flash memory device.

15. The method of claim 14, wherein said performance factors of said flash memory device comprise one or more of endurance, number of program/erase cycles, number of read cycles, retention time, temperature, temperature changes, process corner, inter-cell interference (ICI) impact, location of one or more memory cells within a memory array of said flash memory device, location of a wordline from which said one or more read values is obtained, location of said given page from which said one or more read values is obtained, location of said given page within a wordline from which said one or more read values is read, and a pattern of aggressor cells.

16. The method of claim 14, wherein one or more of said performance factors of said flash memory device can be varied for one or more of different bits within a memory cell, different pages within a wordline, different bit lines, and different hard read data values.

17. The method of claim 1, wherein said converting of said one or more read values for said plurality of bits to the reliability value employs a distribution marginalization.

18. The method of claim 17, wherein said distribution marginalization computes the reliability value for said given bit given that a first pattern was read, wherein said reliability value for said given bit is based on multiple probabilities for different patterns that were written given that said first pattern was read.

19. A tangible machine-readable recordable storage medium for processing data from a flash memory device, wherein one or more software programs stored on said storage medium when executed by one or more processing devices implement the steps of the method of claim 1.

20. A flash memory system, comprising:
a reliability unit for converting one or more read values for a plurality of bits in one or more pages to a reliability value for a given bit among said plurality of bits based on a probability that a data pattern was written to said plurality of bits given that a particular pattern was read from said plurality of bits; and
a decoder for decoding said given bit in a given page of said one or more pages using said reliability value.

21. The flash memory system of claim 20, wherein said decoding is performed in real-time.

22. The flash memory system of claim 20, wherein said reliability value comprises one or more of a log-likelihood ratio and an approximation of a log-likelihood ratio.

23. The flash memory system of claim 20, wherein said reliability unit is configured to generate said reliability value for said given bit in said given page using one or more of (i) read values for additional bits of said given page, and (ii) read values for one or more additional bits of at least one additional page in a same wordline as said given page.

24. The flash memory system of claim 20, wherein said probability that said data pattern was written to said plurality of bits given that said particular pattern was read from said plurality of bits is obtained from one or more tables.

25. The flash memory system of claim 24, wherein one or more of (i) said data pattern and (ii) said particular pattern comprises one or more of (i) said given bit and at least one additional bit in said given page; (ii) said given bit and at least one additional bit in a same cell as said given bit; and (iii) said given bit and at least one additional bit in a different cell as said given bit.

26. The flash memory system of claim 20, wherein said probability that said data pattern was written to said plurality of bits given that said particular pattern was read from said plurality of bits is based on one or more of one or more reference cells, one or more prior decoded decisions and one or more performance factors of a flash memory device accessed by said flash memory system.

27. The flash memory system of claim 26, wherein said performance factors of said flash memory device comprise one or more of endurance, number of program/erase cycles, number of read cycles, retention time, temperature, temperature changes, process corner, inter-cell interference (ICI) impact, location of one or more memory cells within a memory array of said flash memory system, location of a wordline from which said one or more read values is obtained, location of said given page from which said one or more read values is obtained, location of said given page within a wordline from which said one or more read values is read, and a pattern of aggressor cells.

28. The flash memory system of claim 26, wherein one or more of said performance factors of said flash memory device can be varied for one or more of different bits within a memory cell, different pages within a wordline, different bit lines, and different hard read data values.

29. The flash memory system of claim 20, wherein said one or more read values for said plurality of bits are converted to the reliability value using a distribution marginalization.

30. The flash memory system of claim 29, wherein said distribution marginalization computes the reliability value for said given bit given that a first pattern was read, wherein said reliability value for said given bit is based on multiple probabilities for different patterns that were written given that said first pattern was read.

* * * * *